United States Patent
Bonser et al.

(10) Patent No.: US 7,268,066 B2
(45) Date of Patent: *Sep. 11, 2007

(54) METHOD FOR SEMICONDUCTOR GATE LINE DIMENSION REDUCTION

(75) Inventors: Douglas J. Bonser, Austin, TX (US); Marina V. Plat, San Jose, CA (US); Chih Yuh Yang, San Jose, CA (US); Scott A. Bell, San Jose, CA (US); Srikanteswara Dakshina-Murthy, Austin, TX (US); Philip A. Fisher, Foster City, CA (US); Christopher F. Lyons, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 512 days.

This patent is subject to a terminal disclaimer.

(21) Appl. No.: 10/922,093

(22) Filed: Aug. 19, 2004

(65) Prior Publication Data
US 2005/0020019 A1 Jan. 27, 2005

Related U.S. Application Data

(63) Continuation of application No. 10/334,337, filed on Dec. 30, 2002, now Pat. No. 6,849,530.

(60) Provisional application No. 60/400,384, filed on Jul. 31, 2002.

(51) Int. Cl.
*H01L 21/4763* (2006.01)

(52) U.S. Cl. .................. 438/585; 438/595; 438/636
(58) Field of Classification Search ............... 438/585, 438/586, 595, 636; 257/288, 327, 336
See application file for complete search history.

(56) References Cited

U.S. PATENT DOCUMENTS

| 4,795,718 | A | 1/1989 | Beitman |
| 5,089,863 | A | 2/1992 | Satoh et al. |
| 5,650,343 | A | 7/1997 | Luning et al. |
| 5,741,736 | A | 4/1998 | Orlowski et al. |
| 5,883,011 | A | 3/1999 | Lin et al. |
| 6,010,829 | A | 1/2000 | Rogers et al. |
| 6,013,570 | A | 1/2000 | Yu et al. |
| 6,091,120 | A | 7/2000 | Yeom et al. |
| 6,140,218 | A | 10/2000 | Liu et al. |
| 6,362,033 | B1 | 3/2002 | Lee et al. |
| 6,849,530 | B2 * | 2/2005 | Bonser et al. .............. 438/585 |

FOREIGN PATENT DOCUMENTS

| JP | 03-227024 | 8/1991 |
| WO | WO 02/33739 | 4/2002 |

* cited by examiner

*Primary Examiner*—Kevin M. Picardat
(74) *Attorney, Agent, or Firm*—Foley & Lardner LLP

(57) ABSTRACT

To reduce the width of a MOSFET gate, the gate is formed with a hardmask formed thereupon. An isotropic etch is then performed to trim the gate in order to reduce the width of the gate. The resulting gate may be formed with a width that is narrower than a minimum width achievable solely through conventional projection lithography techniques.

11 Claims, 4 Drawing Sheets

METHOD FOR SEMICONDUCTOR GATE LINE DIMENSION REDUCTION

CONTINUING DATA

This application is a continuation of U.S. application Ser. No. 10/334,337, filed 30 Dec. 2002, now issued as U.S. Pat. No. 6,849,530, which claimed priority from U.S. Provisional Application Ser. No. 60/400,384, filed 31 Jul. 2002.

BACKGROUND

1. Field of the Invention

Embodiments of the present invention relate to semiconductor fabrication, and in particular, to methods for reducing the width of MOSFET gate structures.

2. Related Art

The demand for increased performance and greater functionality in semiconductors has driven the semiconductor industry to develop processes that pack more and more devices onto a substrate to create higher device densities. One approach to packing more devices onto a substrate is to shrink the size of the individual devices and their components. For example, a MOSFET may be made to operate faster by reducing the width of the gate line that drives its gate, and hence the channel width of the device.

Improving the lithographic techniques that are used to define device patterns is one focus of this approach. Conventional photolithography techniques such as projection lithography define devices by transferring their patterns to a photoresist material that is coated on a semiconductor substrate. Using a series of optics, an image of a pattern representing an integrated circuit device is projected onto the photoresist. Current projection lithography is able to reduce critical geometries of the projected images to approximately 100 nm. However, because the demand for higher packing densities and increased performance requires that MOSFET gate widths be reduced below 100 nm, to 50 nm or less, conventional projection lithography techniques for gate formation will soon be inadequate.

Accordingly, recent approaches to further reduction of device dimensions have focused on supplementing conventional projection lithography techniques through additional photoresist processing. One such technique involves trimming a photoresist mask by isotropic etching to reduce the size of the mask beyond the minimum size achievable through projection lithography. An example of this technique is illustrated in FIG. 1. As shown in FIG. 1, a photoresist mask 2 form defining the shape of a MOSFET gate is formed by projection lithography over a multi-layered structure that includes an antireflective (ARC) layer 4, a gate conductive layer 6 formed of polysilicon, and a gate insulating layer formed of $SiO_2$. The multi-layered structure is formed over a semiconductor substrate 10 that includes field isolations 12 that define the boundaries of MOSFET source and drain regions. For purposes of this example, it is assumed that the photoresist mask 2 has the minimum width achievable through projection lithography alone. It can be seen in FIG. 1 that through subsequent anisotropic etching using the photoresist mask 2 as an initial etch mask, the width of structures formed by etching the conductive gate material 6 and gate insulator 8 will be limited to the width of the photoresist mask 2. However, in accordance with the gate trim technique, the photoresist mask 2 is subjected to an isotropic etch that removes photoresist material, leaving a trimmed photoresist mask 14. The trimmed photoresist mask 14 is then used to pattern the underlying layers, resulting in a gate that has a width that is less than the minimum width achievable through projection lithography.

The resist trim technique is limited by the fact that a minimum thickness of photoresist is required in order to successfully transfer the shape of the photoresist mask to underlying layers. Accordingly, the improvements in gate size provided by the resist trim technique are also limited.

Consequently, there is a need for further techniques for providing further reductions in gate widths.

SUMMARY OF THE DISCLOSURE

It is an object of the present invention to provide a method for reducing MOSFET gate dimensions.

In accordance with a preferred embodiment of the invention, a gate having a self-aligned hardmask on its top surface is formed by a primary anisotropic etch that uses a photoresist mask as an initial etch mask. A secondary isotropic etch is then performed to trim the gate. The hardmask is then removed, leaving a gate that is narrower than the initial photoresist mask.

DESCRIPTION OF THE DRAWINGS

Preferred embodiments of the invention will hereafter be described with reference to the accompanying drawings, wherein like numerals denote like elements, and in which.

DETAILED DESCRIPTION OF PREFERRED EMBODIMENTS

Figure 1:
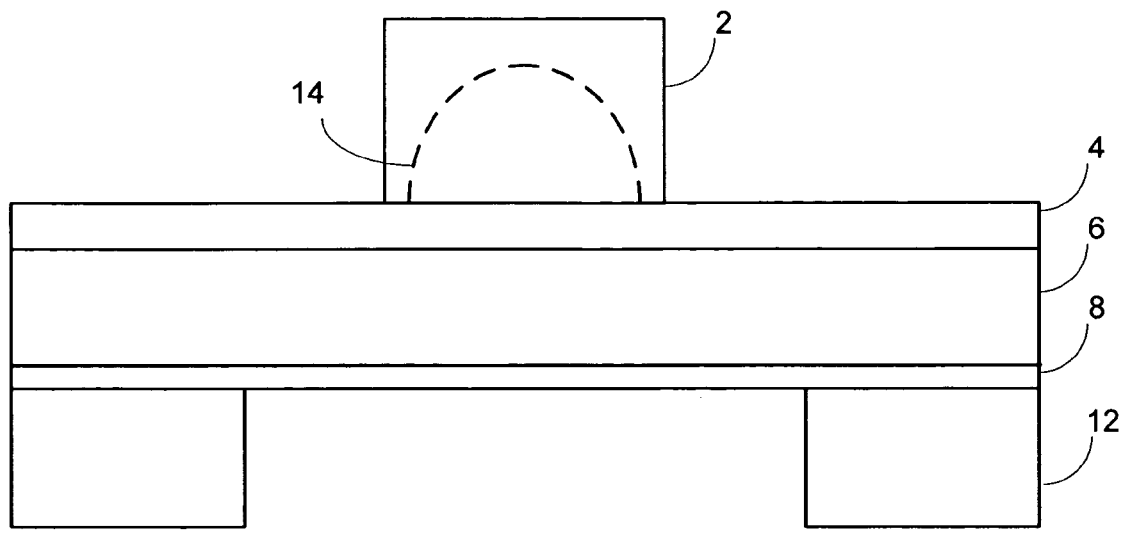
FIG. 1 shows a semiconductor structure formed in accordance with a conventional resist trim technique.
Figure 2A:
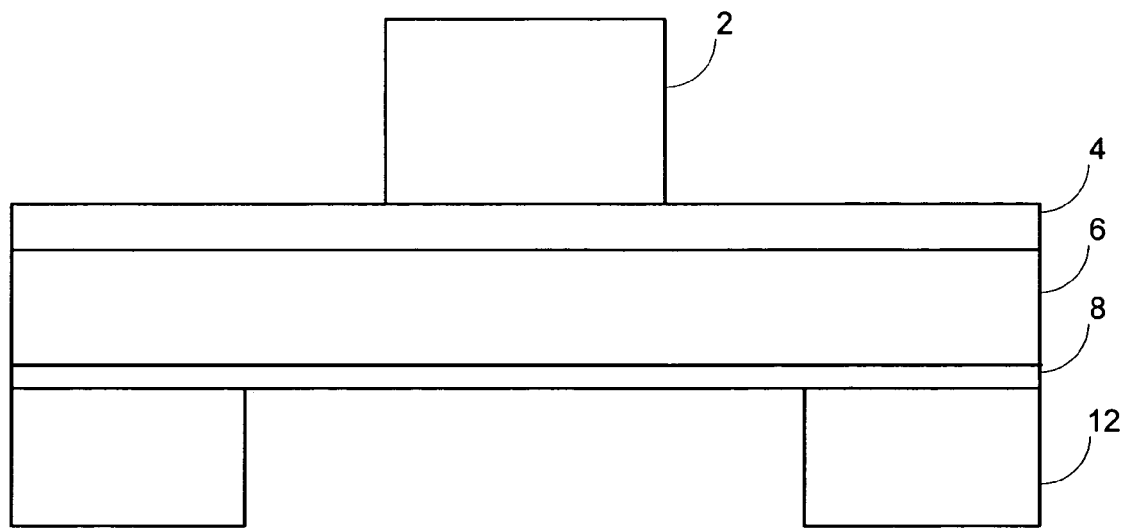
FIGS. 2a, 2b, 2c and 2d show structures formed during processing in accordance with a preferred embodiment of the invention.

Structures formed during processing in accordance with a preferred embodiment of the invention are shown in FIGS. 2a-2d. FIG. 2a shows a structure similar to that of FIG. 1, including a photoresist mask 2, ARC layer 4, gate conductive layer 6, gate insulating layer 8, semiconductor substrate 10, and field isolations 12. In the preferred embodiment the ARC is formed of SiON or silicon rich nitride, the gate conductive layer is doped polysilicon, and the gate insulating layer is $SiO_2$.

Figure 2B:
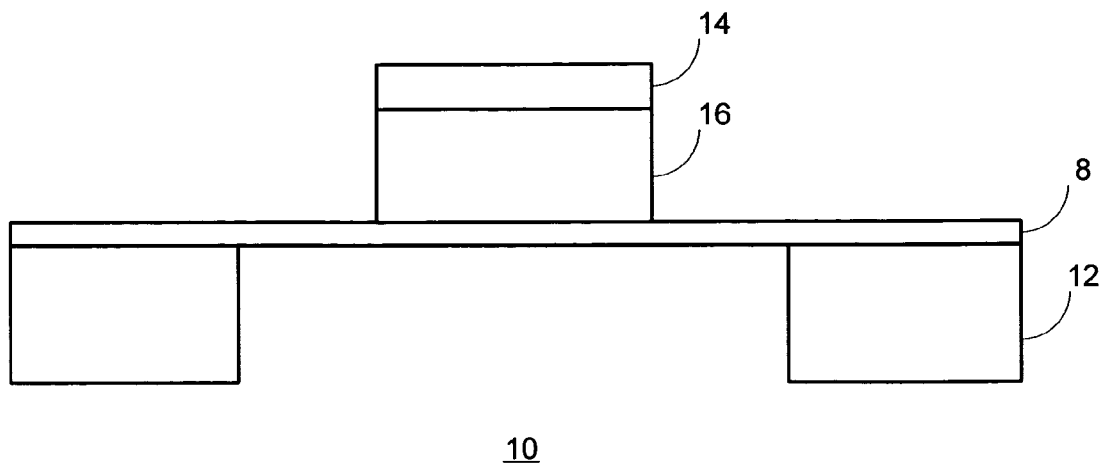

FIG. 2b shows the structure of FIG. 2a after a primary anisotropic etch comprising one or more anisotropic etches has been performed to etch the ARC layer and gate conductive layer to form a gate 16 having a self-aligned hardmask 14 thereupon. The ARC layer is typically etched using a combination of Ar and $CF_4$, while the polysilicon is typically etched using a combination of HBr, CL, HE, oxygen and $CF_4$. The photoresist mask is stripped during or after the primary etch.

Figure 2C:
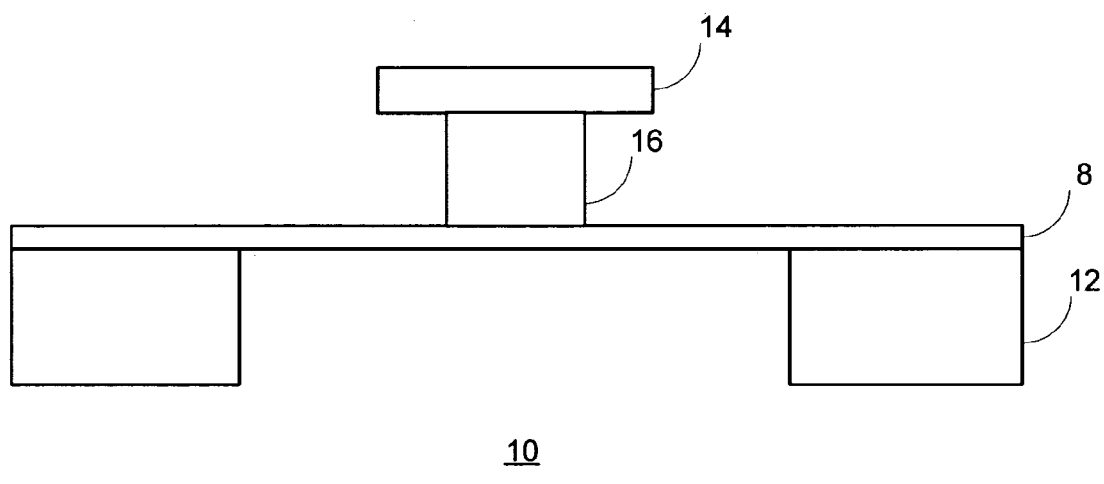

FIG. 2c shows the structure of FIG. 2b after a secondary etch of the gate has been performed to narrow the gate 16. The secondary etch is isotropic and is selective with respect to the gate material so that the ARC 14 is relatively unaffected. This causes the trimming effect of the secondary etch to be approximately uniform along the height of the gate 16. The resulting structure has a trimmed gate that is narrower than the overlying hardmask, such that the edges of the hardmask extend beyond the edges of the gate.

Figure 2D:
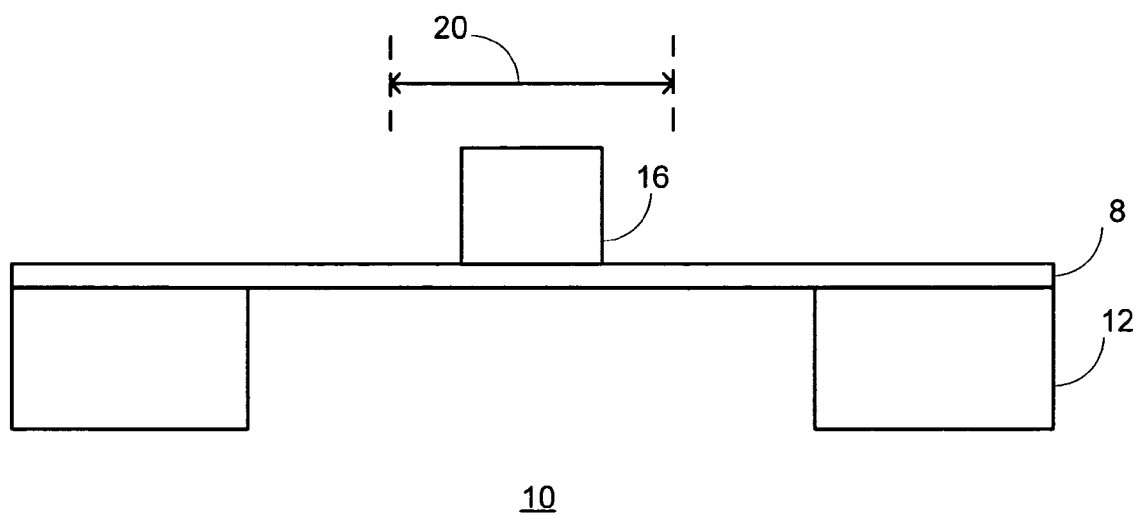

FIG. 2d shows the structure of FIG. 2c after removal of the hardmask.

After the structure of FIG. 2d is formed, additional conventional processing may be performed, such as formation of source and drain diffusions, deposition of an interlevel dielectric, formation of source and drain contacts, and replacement of the polysilicon gate with a metal gate.

While the process flow of FIGS. 2a-2d is presently considered to be the preferred embodiment of the invention, a wide variety of alternative embodiments in accordance with the invention may be formulated. For example, the materials used for the ARC/hardmask, conductive gate layer, and gate insulating layer may be varied in accordance with the particular implementation. The ARC/hardmask may be formed of silicon oxide, silicon nitride or silicon oxynitride, while the gate insulating layer may be formed of alternative high k materials such as ZrO.

Further, additional processing may be performed to trim the photoresist mask using the conventional trim process described above prior to etching the ARC and gate conductive layer.

In addition, it will be apparent to those having ordinary skill in the art that the tasks described in the preferred embodiment are not necessarily exclusive of other tasks, but rather that further tasks may be incorporated in accordance with the particular structures to be formed. For example, processing tasks such as seed layer formation, seed layer enhancement, formation and removal of passivation layers or protective layers between processing tasks, formation and removal of photoresist masks and other masking layers such as antireflective layers, formation of isolation structures, as well as other tasks, may be performed along with the tasks specifically described above. Further, the process need not be performed on an entire substrate such as an entire wafer, but rather may be performed selectively on sections of the substrate.

Figure 3:
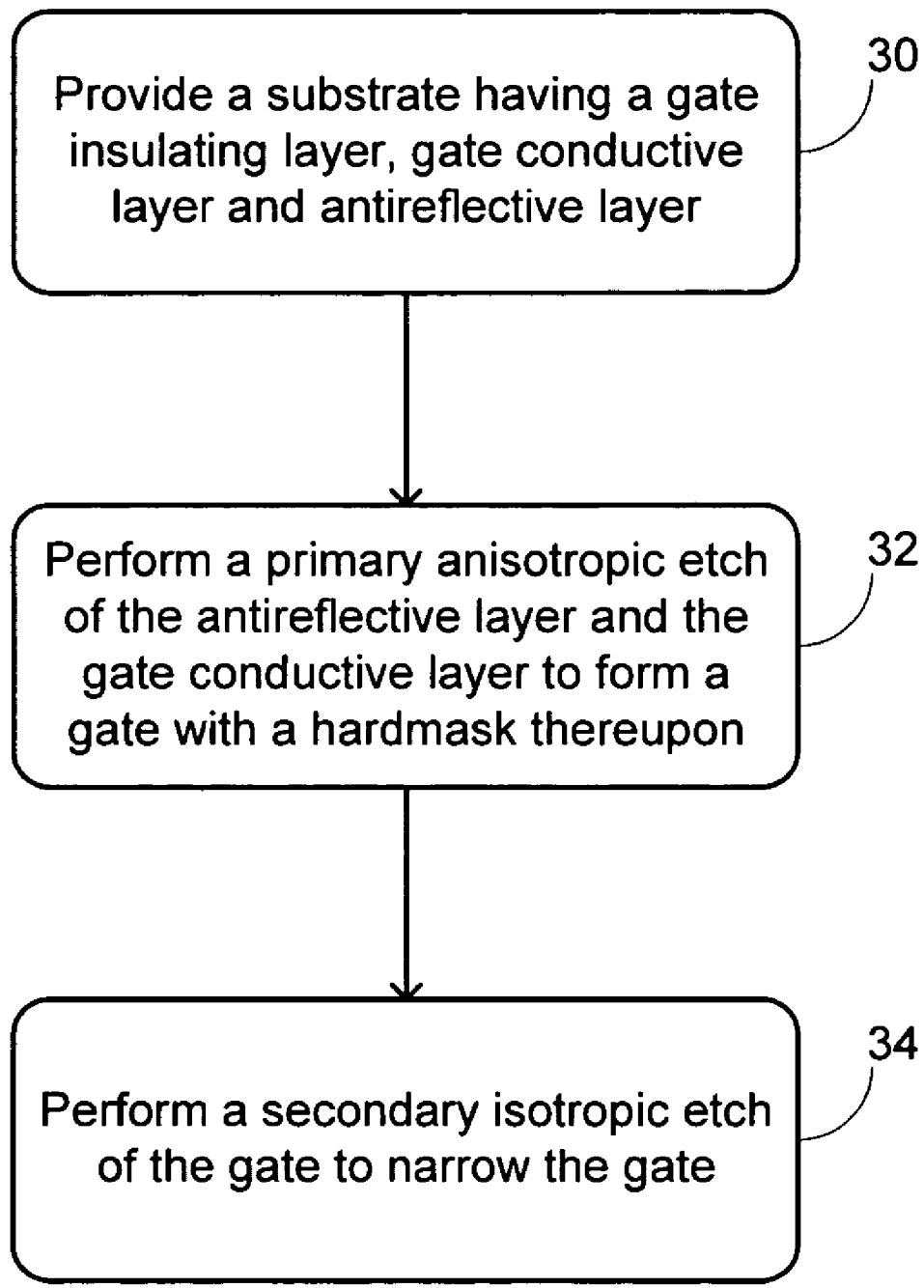
FIG. 3 shows a process flow encompassing the preferred embodiment of the invention and alternatives thereto.

FIG. 3 shows a process flow for forming a MOSFET that encompasses the preferred embodiment and its aforementioned alternatives, as well as other alternative embodiments that are not explicitly discussed here but will be apparent to those of ordinary skill in the art. As shown in FIG. 3, substrate is initially provided (30). The substrate has stacked thereupon a gate insulating layer, a gate conductive layer and an antireflective layer. A primary anisotropic etch is then performed on the antireflective coating and the gate conductive layer to form a gate having a self-aligned hardmask thereupon (32). A secondary isotropic is then performed on the gate to narrow the gate (34).

While the invention has been described with reference to its preferred embodiments, those skilled in the art will understand and appreciate from the foregoing that variations in equipment, operating conditions and configuration may be made and still fall within the spirit and scope of the present invention which is to be limited only by the claims appended hereto.

What is claimed is:

1. A method for forming a structure of a semiconductor device, comprising:
providing a substrate having stacked thereupon a gate insulating layer, a gate conductive layer and a hardmask layer;
etching the hardmask layer to form a hardmask on the gate conductive layer;
performing a substantially anisotropic etch of the gate conductive layer while protecting a portion of the gate conductive layer with the hardmask to form a gate structure having the hardmask thereupon;
performing a substantially isotropic etch to narrow the gate structure using an etchant that is selective of material of the gate structure with respect to material of the hardmask layer and material of the gate insulating layer;
removing the hardmask from the gate structure; and
forming source and drain dopant regions at opposing sides of the gate structure after removing the hardmask.

2. The method claimed in claim 1, further comprising forming an interlevel dielectric layer over the gate structure and the substrate.

3. The method claimed in claim 2, further comprising forming respective source and drain contacts in contact with the source and drain regions.

4. The method claimed in claim 1, wherein the gate structure is a polysilicon gate, and wherein the method further comprises replacing the polysilicon gate with a metal gate.

5. The method claimed in claim 1, wherein said hardmask is formed by etching the hardmask layer using a photoresist mask as an etch mask.

6. The method claimed in claim 5, wherein said photoresist mask is subjected to an isotropic etch to trim said photoresist mask prior to etching said hardmask layer.

7. The method claimed in claim 1, wherein the hardmask layer is silicon oxide.

8. The method claimed in claim 1, wherein the hardmask layer is silicon nitride.

9. The method claimed in claim 1, wherein the hardmask layer is silicon oxynitride.

10. The method claimed in claim 1, wherein the hardmask layer is etched using a combination of Ar and $CF_4$.

11. The method claimed in claim 1, wherein the gate conductive layer is etched using a combination of HBr, CL, HE, oxygen and $CF_4$.

* * * * *